United States Patent

Louth

[11] Patent Number: 5,921,643
[45] Date of Patent: *Jul. 13, 1999

[54] ZERO CLEARANCE LOCATING AND CONNECTING PIN AND CONNECTING SYSTEM USING SAME

[75] Inventor: Terry W. Louth, Narvon, Pa.

[73] Assignee: Unisys Corporation, Blue Bell, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/635,122

[22] Filed: Apr. 19, 1996

[51] Int. Cl.$^6$ ........................................... F16B 12/00
[52] U.S. Cl. ..................... 312/111; 403/393; 312/223.1
[58] Field of Search ................................. 403/393, 353; 312/111, 223.2, 223.1, 108, 263, 265.5; 361/724, 725, 726, 727, 732, 829, 683; 220/4.03, 4.02, 3.94

[56] References Cited

U.S. PATENT DOCUMENTS

| | | |
|---|---|---|
| 418,688 | 1/1890 | Converse . |
| 3,194,619 | 7/1965 | Dannenberg ........................ 312/263 X |
| 3,360,321 | 12/1967 | Novales .............................. 312/263 X |
| 3,425,025 | 1/1969 | Williams . |
| 3,563,624 | 2/1971 | Stice ........................................ 312/111 |
| 4,201,428 | 5/1980 | Johnson .............................. 312/111 X |
| 4,215,386 | 7/1980 | Prager et al. . |
| 4,225,265 | 9/1980 | Hooker et al. ...................... 403/393 X |
| 4,501,460 | 2/1985 | Sisler . |
| 4,826,263 | 5/1989 | Speraw .................................... 312/111 |
| 4,844,565 | 7/1989 | Brafford et al. .................... 312/111 X |
| 4,881,844 | 11/1989 | Tremblay ............................ 403/353 X |
| 4,969,065 | 11/1990 | Petri . |
| 5,025,937 | 6/1991 | King .................................... 403/353 X |
| 5,194,693 | 3/1993 | Brzozowski et al. . |
| 5,214,569 | 5/1993 | Hsiang . |

FOREIGN PATENT DOCUMENTS 1374952  9/1964  France ................................. 312/263

*Primary Examiner*—Peter M. Cuomo
*Assistant Examiner*—Janet M. Wilkens
*Attorney, Agent, or Firm*—Steven B. Samuels; Mark T. Starr; Rocco L. Adornato

[57] ABSTRACT

A zero clearance connecting system for use in locating and connecting together first and second housings, with each housing having a predefined interior envelope, is provided. The system comprises a locating and connecting pin having first and second ends attached to the first housing. A head is located at the first end of the pin and has a reduced diameter portion. A shank portion is located adjacent to the head and installed in an aperture defined in a surface of the first housing, with the head protruding from the surface by a predetermined distance. A slot having a large portion and a smaller portion is defined in a mating surface of the second housing. The smaller portion of the slot is in a complementary position to the head when the first and second housings are located and connected together. The large portion of the slot is sized for insertion of the head into the slot. The smaller portion of the slot has keyed side walls which are complementary to the reduced diameter portion of the head such that the reduced diameter portion of the head engages the keyed side walls of the smaller portion of the slot when the first housing is slidingly moved relative to the second housing. The head has a thickness which is not greater than the thickness of the mating surface of the second housing such that the head does not protrude into the interior envelope of the second housing.

7 Claims, 2 Drawing Sheets

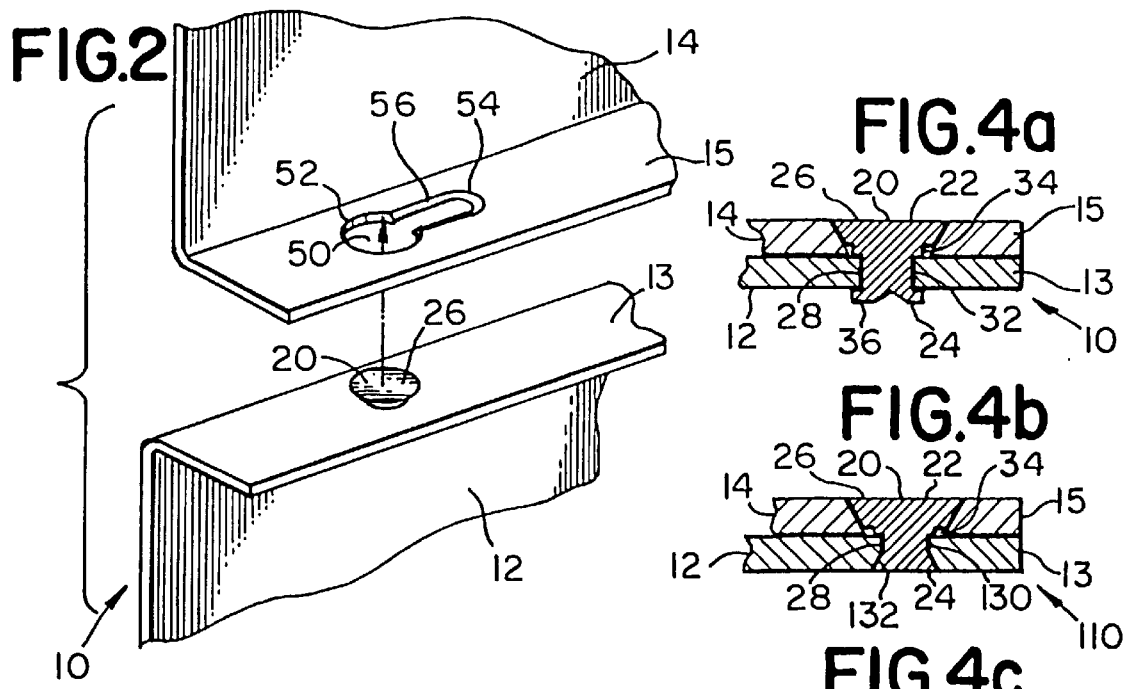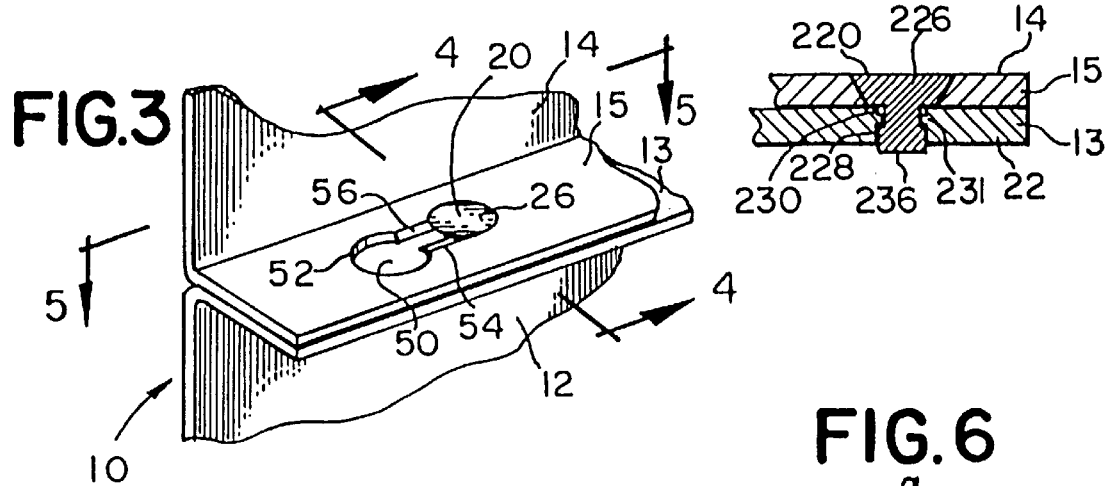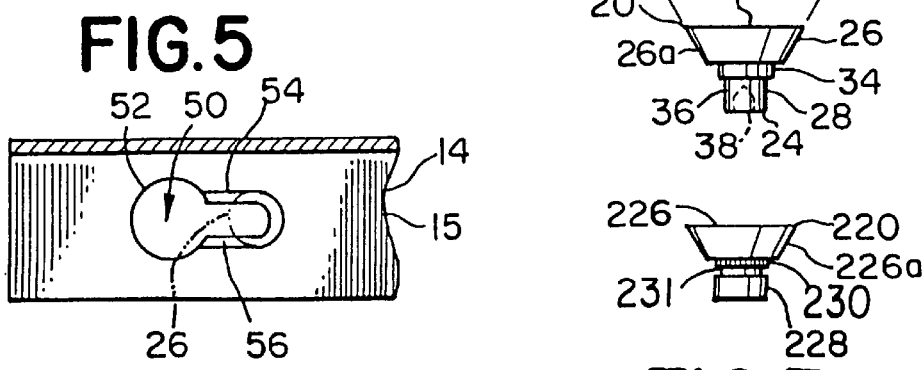

ZERO CLEARANCE LOCATING AND CONNECTING PIN AND CONNECTING SYSTEM USING SAME

FIELD OF THE INVENTION

The present invention relates to connectors for connecting together modular housings for computer/electronic devices as well as other types of components, and more particularly to a zero clearance connecting system for slidably connecting together first and second housings without affecting the interior envelope of the modular housings.

BACKGROUND OF THE INVENTION

Many electrical assemblies are assembled from a plurality of functional units located in separable modular housings which are connected together, both mechanically and electrically, to fulfill a particular customers requirements. For example, in some large computing systems, depending on a user's requirements, different modules are connected together to provide the required hardware for performing desired functions. Generally, each functional unit includes circuit boards, which may be in the form of plug in cards, as well as other components, such as hard drives or tape drives, which are assembled in a modular housing. When additional functional capabilities are required, additional modular housings are connected together to expand the system.

In one known modular housing system, computer systems are assembled from functional units. The functional units are assembled to each other through the use of a plurality of hook members on one side of a first type of modular unit housing which are passed through corresponding apertures in the wall of a second type of modular unit housing and captured and restrained by a latch bar located in one housing. However, due to the configuration of the hook members, the interior envelope of the modular unit housing in which the hook members are inserted must be modified such that a clearance area is provided in relation to the internal components of the modular unit for insertion of the hook members and for the latch bar. Additionally, no means are provided for sealing the modules together to prevent electromagnetic interference (EMI) due to poor electrical bonding between the modular unit housings.

In another known system, a pair of mechanically separate and electrically related plug-in units are mechanically and electrically mated in side-by-side relationship to form a unitary module. A slidable latch member is provided on a first unit and includes a plurality of latch buttons that are adapted to fit through keyhole slots in the second unit. After the buttons are inserted into the keyhole slots, the latch member is slidingly moved such that the heads of the buttons are moved to a narrower portion of the keyhole slots in the second unit to mechanically connect the units together. Again, the modular unit in which the buttons are inserted must include a clearance space for the heads of the buttons such that they do not interfere with internal components located in the second plug-in unit. Additionally, no electromagnetic sealing between the plug-in units is provided.

Other known connector systems use various types of connecting pin and keyhole arrangements, or mechanical fasteners such as screws and nut plates. However, in each instance the mechanical connecting components extend into the interior envelope of the first and/or second housings which are being connected together.

SUMMARY OF THE INVENTION

The present invention is directed to a connecting and locating pin (forming a connecting system) for latching together separate modular housings containing computer and related electronic equipment. The connecting system is fully integrated within the surfaces of the modular housings when latched together, and thus, does not protrude into the interior envelopes of the modular housings. The present invention also provides an electromagnetic interference (EMI) seal between modular housings (which are connected together without the need for auxiliary EMI sealing measures), because the connecting system permits the modular housings to be fastened together without gaps between them.

In more detail, the present invention is a zero clearance connecting system (i.e. a connecting system which does not protrude into the interior envelope of one or both modular housings which are being connected) for use in locating and connecting together first and second housings, with each housing having a predefined interior envelope and a mating surface. The system comprises a locating and connecting pin having first and second ends which is attached to the first housing. A head is located at the first end of the locating and connecting pin and a shank portion is located adjacent to the head. The head has a reduced diameter portion. The shank portion is located in an aperture defined in the mating surface of the first housing, with the head protruding from the surface of the first housing by a predetermined distance. A slot having a large portion and a smaller portion is defined in the mating surface of the second housing. The smaller portion of the slot is in a complementary position to the head when the first and second housings are located and connected together. The large portion of the slot is sized for insertion of the head into the slot. The smaller portion of the slot has keyed side walls which are complementary to the reduced diameter portion of the head such that the reduced diameter portion of the head engages the keyed side walls of the smaller portion of the slot when the first housing is slidingly moved relative to the second housing. The head has a thickness which is not greater than the mating surface of the second housing such that the head does not protrude into the interior envelope of the second housing.

The present invention also provides a zero clearance locating and connecting pin adapted for connecting together first and second housings, with each housing having a predefined interior envelope. The first and second housings each have a mating surface with a predetermined thickness. The locating and connecting pin comprises a pin having first and second ends. A head is located at the first end of the pin and a shank portion is located adjacent to the head. The head has a reduced diameter portion and a thickness which is not greater than the predetermined thickness of the second surface. The shank is sized to fit in an aperture defined in the mating surface of the first housing and the head is sized to fit in a keyed slot in the mating surface of the second housing such that the head is adapted to not protrude into the interior envelope of the second housing.

In another aspect, the present invention provides a zero clearance pin connector for connecting first and second housings of electrical devices to provide an electromagnetic interference seal between the housings. The first and second housings have mating surfaces, each having a predetermined thickness. A plurality of locating and connecting pins are located on the mating surface of the first housing at least every four inches around the periphery of the mating surface, and a plurality of complementarily positioned slots are located on the mating surface of the second housing. Each connecting pin comprises a pin having first and second ends, with a head located at the first end of the connecting pin and a shank portion located adjacent to the head. The head has a reduced diameter portion and a thickness which is not greater than the predetermined thickness of the mating surface of the second housing. The shank is sized to fit in an aperture defined in the first surface and the head is sized to be received in a keyed slot located in the mating surface of the second housing such that the head does not protrude into the interior envelope of the second housing when the first and second housings are connected together.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 2 is a greatly enlarged perspective view, partially disassembled, showing a portion the connecting system of FIG. 1;

FIG. 3 is a greatly enlarged, assembled perspective view similar to FIG. 2 showing portions of first and second housings connected together using the connecting system in accordance with the present invention;

FIG. 4a is cross-sectional view of a first embodiment of a zero clearance connecting system in accordance with the present invention taken along line 4—4 in FIG. 3;

FIG. 4b is a cross-sectional view of a second embodiment of a zero clearance connecting system in accordance with the present invention taken along line 4—4 in FIG. 3;

FIG. 4c is a cross-sectional view of a third embodiment of a zero clearance connecting system in accordance with the present invention taken along line 4—4 in FIG. 3.

FIG. 5 is a top view taken along lines 5—5 in FIG. 3.

FIG. 6 is an elevational view of the locating and connecting pin shown in FIG. 4a;

FIG. 7 is an elevational view of the locating and connecting pin shown in FIG. 4c.

DETAILED DESCRIPTION OF PREFERRED EMBODIMENTS

Figure 1:
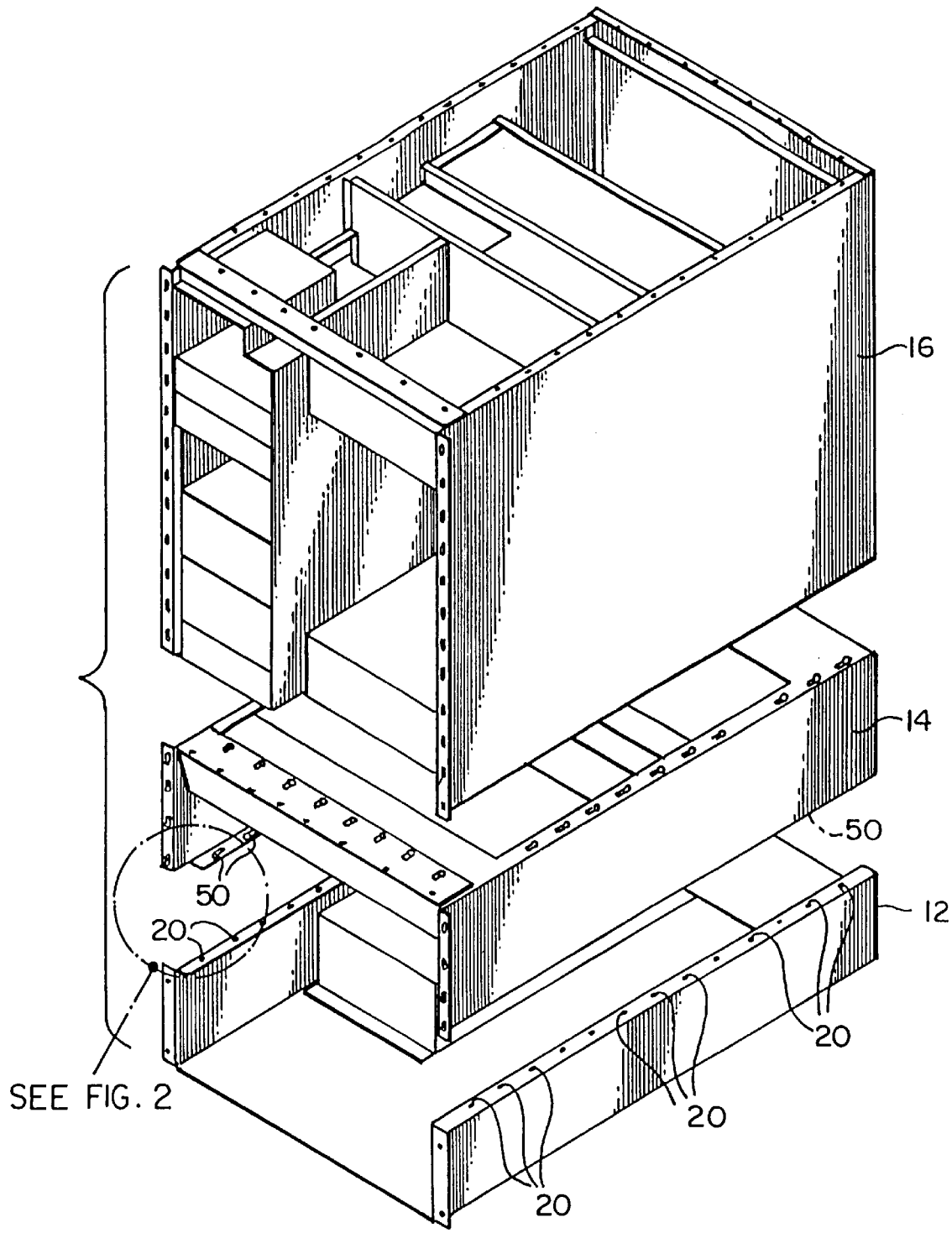
FIG. 1 is a partially disassembled perspective view of first and second housings being connected together with a zero clearance connecting system in accordance with a preferred embodiment of the present invention.

Certain terminology is used in the following description for convenience only and is not limiting. The words "right," "left," "lower" and "upper" designate directions in the drawings to which reference is made. The words "inwardly" and "outwardly" refer to directions toward and away from, respectively, the geometric center of the connecting system for use in locating and connecting together first and second housings and designated parts thereof. The terminology includes the words above specifically mentioned, derivatives thereof and words of similar import.

Referring to the drawings, wherein like numerals indicate like elements throughout, there is shown in FIGS. 1–4a, 5 and 6 a first preferred embodiment of a connecting system 10 for use in locating and connecting together first and second housings 12 and 14 for electrical components, such as computer modules 12, 14, 16. Generally, each housing 12, 14, 16 has an interior envelope predefined by the inside of the housing wall surfaces. Circuit boards, drives as well as other electrical components (not shown) are located within the interior envelope of each housing. Each housing 12, 14 includes at least one mating surface 13, 15 having a predetermined thickness.

As shown in FIGS. 2, 3, 4a and 6, a first zero clearance locating and connecting pin 20 having first and second ends 22, 24 is attached to the first housing 12. A head 26 is located at the first end 22 of the locating and connecting pin 20 and a shank portion 28 is located adjacent to the head, as shown in FIGS. 4a and 6.

Referring now to FIG. 6, the head 26 has a reduced diameter portion 26a which is preferably in the form of a tapered side wall. Preferably, the reduced diameter portion 26a of the head 26 is reduced at an area away from the first end 22 of the locating and connecting pin 20. Those of ordinary skill in the art will recognize that the reduced diameter portion could take the form of a recess, square cut or any other form, if desired, and it is not required that the reduced diameter portion 26a of the head 26 be a taper or that the taper be a particular angle.

Referring again to FIGS. 4a and 6, in the first preferred embodiment of the locating and connecting pin 20, a shoulder 34 is preferably located between the head 26 and the shank portion 28. The shoulder 34 is located adjacent to the mating surface 13 of the first housing 12.

Referring now to FIGS. 2 and 4a, the shank portion 28 is preferably located in an aperture 32 defined in the mating surface 13 of the first housing 12. The head 26 protrudes from the surface 13 of the first housing 12 by a predetermined distance which is less than the thickness of the mating surface 15 of the second housing 14, as explained in detail below. Preferably, the shank portion 28 includes a tail portion 36. The tail portion 36 is deformed to secure the locating and connecting pin 20 in position in the aperture 32. Those of ordinary skill in the art will recognize that the tail portion 36 may include a cavity 38 to allow for easier deformation of the tail portion 36 to secure the locating and connecting pin 20 in position.

Referring now to FIGS. 2, 3 and 5, a slot 50 having a large portion 52 and a smaller portion 54 is defined in the mating surface 15 of the second housing 14. The smaller portion 54 of the slot 50 is located in a complementary position to the head 26 of the connecting pin 20 when the first and second housings 12 and 14 are connected together, as illustrated in FIG. 3. In the first preferred embodiment, the mating surfaces 13, 15 of the first and second housings 12, 14 are in the form of flanges. However, those of ordinary skill in the art will recognize that the mating surface could be a top, side or bottom panel of the housing 12, 14, or channel shaped sections which extend out from the housing 12, 14.

Referring now to FIG. 5, the large portion 52 of the slot 50 is sized for a clearance fit with the head 26 such that the head 26 can be inserted into the slot 50. The smaller portion 54 of the slot 50 has keyed side walls 56 which are complementary to the reduced diameter portion 26a of the head 26 such that the reduced diameter portion 26a of the head 26 engages the keyed side walls 56 of the smaller portion 54 of the slot 50 when the first housing 12 is slidingly moved relative to the second housing 14, as shown by FIGS. 2 and 3. The head 26 is shown in phantom in FIG. 5 with the head 26 engaged in the smaller portion 54 of the slot 50. The predetermined distance which the head 26 protrudes from the first housing 12 is not greater than the thickness of the mating surface 15 of the second housing 14 such that the head 26 does not protrude into the interior envelope of the second housing 14.

In the first preferred embodiment, the head 26 has a diameter of approximately 0.240 inches and the side walls of the head are tapered at an angle α, as shown in FIG. 6, which is approximately 60°. Preferably, the head has a thickness of approximately 0.028 inches and the shoulder has a depth of approximately 0.020 inches. Preferably, the first and second housings are at least 0.048 inches thick or greater such that the combined thickness of the shoulder 34 and the head 26 is less than the thickness of the mating surface 15 of the second housing 14. Preferably, the large portion 52 of the slot is a circular opening approximately 0.265 inches in diameter to provide a clearance fit for the head 26 as it is inserted therein. The smaller portion of the slot preferably has an opening approximately 0.195 inches wide and the keyed side wall 56 is in the form of a 60° taper which is complementary to the 60° taper on the reduced diameter portion 26a of the head 26. However, it will be recognized by those skilled in the art that the dimensions of the connecting pin 20 and the slot 50 could be varied, if desired.

In the preferred embodiment, the locating and connecting pin 20 is made of aluminum or steel. However, those of ordinary skill in the art will recognize that other metallic or non-metallic materials may be used, depending upon the particular application. Those of ordinary skill in the art will also recognize that the reduced diameter portion of the head 26 and the keyed side wall 56 of the slot 50 may take various complementary forms, such as straight tapers or a combination of tapers and steps, and is not necessarily limited to the preferred taper disclosed above. However, the use of a taper does result in a tight connection between the first and second housings 12, 14 since the tapered side wall 56 of the smaller portion 54 of the slot 50 draws the mating surface 15 of the second housing 14 toward the mating surface 13 of the first housing 12 by contacting the complementary taper on the reduced diameter portion 26a of the head 26 during assembly.

Referring again to FIG. 1, in the preferred embodiment, a plurality of locating and connecting pins 20 are located on the mating surface 13 of the first housing 12 and a plurality of slots 50 are defined in the mating surface 15 of the second housing 14 in complementary positions to the locating and connecting pins 20 on the first housing 12. Preferably, the locating and connecting pins 20 are spaced at least every four inches and preferably every three inches around the periphery of the mating surfaces 13 and 15 of the first and second housings 12 and 14 so that after assembly an EMI seal is provided between the first and second housings 12 and 14. The EMI seal is provided by the firm metal to metal contact of the tapered portion 26a on the head 26 of the locating and connecting pin 20 contacting the keyed side wall 56 on the smaller portion 54 of the slot 50 to provide good electrical continuity between the first and second housings 12 and 14. Those of ordinary skill in the art will recognize that in order to have a good EMI seal, the reduced diameter portion 26a of the head 26 and the keyed side wall 56 of the slot 50 must be clean and free of insulating material or coatings in order for good electrical contact to be established upon connecting the first and second housings 12, 14 together. It will be similarly recognized that all of the slots 50 must be aligned in the same direction in order for the first and second housings 12, 14 to be slidingly moved relative to each other such that the connecting pins 20 engage the smaller portion 54 of the slot 50.

Referring now to FIG. 4b, a second preferred embodiment of a connecting system 110 for use in locating and connecting together first and second housings 12 and 14 is shown. The second preferred connecting system 110 is generally the same as the first preferred embodiment of the connecting system 10, except for the following differences, which are explained in detail below.

As shown in FIG. 4b, the aperture 130 in the mating surface 13 of the first housing 13 includes a countersunk portion 132. The tail portion 36 of the locating and connecting pin 20 is deformed into the countersunk portion 132 to secure the locating and connecting pin 20 in position such that the locating and connecting pin 20 does not protrude into the interior envelope of the first housing 12. This provides a zero clearance connecting system for both the first and second housings 12 and 14 because after the first and second housings 12, 14 are assembled, the locating and connection pin 20 does not protrude into the interior envelope of either the first or second housing 12, 14.

Referring now to FIGS. 4c and 7, a third preferred embodiment of a connecting system 210 for use in locating and connecting together first and second housings 12 and 14 is shown. The third preferred connecting system 210 is generally the same as the first preferred embodiment of the connecting system 10, except for the following differences, which are explained in detail below.

The locating and connecting pin 20 is replaced with a locating and connecting pin 220 in accordance with the third preferred embodiment. The locating and connecting pin 220 is similar to the connecting pin 20 of the first embodiment 10 except that no shoulder is provided between the head 226 and the shank 228. The head 226 includes a reduced diameter portion 226a, which is preferably in the form of a taper, which extends to the first surface 13 when the locating and connecting pin 220 is installed. The shank portion 228 includes a row of serrations 230 in the area adjacent to the head 226. A groove 231 is provided in the shank portion 228 below the row of serrations 230.

Preferably, the locating and connecting pin 220 in accordance with the third preferred embodiment 210 is inserted into a complementary slot 50 in the mating surface 15 of the second housing 14, similar to that described in connection with the first preferred embodiment of the locating and connecting system 10.

In the third preferred embodiment 210, the taper angle of the head 226 is preferably approximately 82°, in comparison with the 60° taper of the first preferred embodiment. Preferably, the thickness of the head is 0.054 inches and the shank has a diameter of 0.142 inches. Preferably, the aperture in the mating surface 13 of the first housing 12 has a diameter of 0.144 inches to provide a close fit to the shank 228, and the locating and connecting pins 220 are installed by squeezing the head 226 and the tail portion 236 to expand the shank 228 such that it engages the aperture 32 in the mating surface 13 of the first housing 12. The row of serrations 230 prevents the connecting pin 220 from spinning in the aperture 32. Due to the increased thickness of the head 226, the locating and connecting pin 220 in accordance with the third preferred embodiment is preferably used for housings 12, 14 having mating surfaces 13, 15 with a thickness of 0.062 inches or greater. However, it will be recognized by those by those skilled in the art from the present disclosure that the dimensions of the locating and connecting pins 20, 220 in accordance with the present invention can be varied, and complementary sized slots 50 can be provided to match the sizes of the locating and connecting pins 20, 220. It will similarly recognized that an EMI seal can be provided through use of the locating and connecting pins 220 in accordance with the third embodiment without the need for auxiliary EMI sealing measures.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A zero-clearance connecting system comprising:

a first and a second housings, each housing having a predefined interior envelope and respective first and second mating surfaces;

a locating and connecting pin having first and second ends connectable to the first housing, a head located at the first end of the locating and connecting pin and a shank portion located adjacent to the head, the head having a reduced diameter portion, and the shank portion being located in an aperture defined in the mating surface of the first housing, with the head protruding from the mating surface of the first housing by a predetermined distance, wherein the shank portion includes a tail portion, and the tail portion is deformed to secure the locating and connecting pin in position;

a slot having a large portion and a smaller portion defined in the mating surface of the second housing, with the smaller portion being in a complementary position to the head when the respective mating surfaces of the first and second housings are located and connected together, the large portion of the slot being sized for insertion of the head into the slot, the smaller portion of the slot having keyed side walls which are complementary to the reduced diameter portion of the head such that the reduced diameter portion of the head engages the keyed side walls of the smaller portion of the slot when the mating surface of the first housing is slidingly moved relative to the mating surface of the second housing, the predetermined distance which the head protrudes from the mating surface of the first housing being not greater than a thickness of the mating surface of the second housing such that the head does not protrude into the interior envelope of the second housing; and wherein the aperture in the mating surface of the first housing includes a countersunk portion, and the tail portion is deformed into the countersunk portion of the aperture to secure the locating and connecting pin in position such that the locating and connecting pin does not protrude into the interior envelope of the first housing, the system locating and connecting together the first and the second housings.

2. The system of claim 1 wherein the tail portion includes a cavity.

3. The system of claim 1 wherein a plurality of locating and connecting pins are located on the mating surface of the first housing, and a plurality of slots are defined in the mating surface of the second housing in complementary positions to the locating and connecting pins.

4. The system of claim 1 wherein the reduced diameter portion of the head is tapered, and the keyed side walls of the smaller portion of the slot include a complementary taper to the tapered head.

5. A zero clearance connecting system comprising:

a first and a second housing of electrical devices, each housing having a predefined interior envelope and a respective mating surface, each mating surface having a predetermined thickness;

a plurality of locating and connecting pins located on the mating surface of the first housing and a plurality of complimentarily positioned slots located on the mating surface of the second housing;

each pin having a head located at a first end of the pin and a shank portion located adjacent to the head, the head having a reduced diameter portion, the shank being located in an aperture defined in the mating surface of the first housing, with the head protruding from the mating surface of the first housing by a predetermined distance;

each slot on the mating surface of the second housing having a keyed portion that is complimentary to the reduced diameter portion of the head of the complimentarily positioned pin on the mating surface of the first housing, the reduced diameter portion of the head of each pin matingly engaging the keyed portion of the corresponding complimentarily positioned slot when the mating surface of the first housing is slidingly moved relative to the mating surface of the second housing, thereby joining the mating surfaces together;

the thickness of the head of each pin being not greater than the predetermined thickness of the mating surface of the second housing such that the heads of the pins do not protrude into the interior envelope of the second housing and wherein the connecting system provides an electromagnetic interference seal between said housings.

6. The zero clearance connecting system of claim 5 wherein the reduced diameter portion of the head of each pin is tapered.

7. A zero clearance connecting system comprising:

a first and a second housing of electrical devices, each housing having a predefined interior envelope and a respective mating surface, each mating surface having a predetermined thickness;

a pin having first and second ends, the pin including a head located at the first end of the pin and a shank portion located adjacent to the head, the head having a reduced diameter portion, the shank being located in an aperture defined in the mating surface of the first housing, with the head protruding from the mating surface of the first housing by a predetermined distance;

a slot on the mating surface of the second housing having a keyed portion that is complimentary to the reduced diameter portion of the head of the complimentarily positioned pin on the mating surface of the first housing, the reduced diameter portion of the head of the pin matingly engaging the keyed portion of the slot when the mating surface of the first housing is slidingly moved relative to the mating surface of the second housing, thereby joining the mating surfaces together;

the thickness of the head of the pin being not greater than the predetermined thickness of the mating surface of the second housing such that the head does not protrude into the interior envelope of the second housing and wherein the connecting system provides an electromagnetic interference seal between said housings.

* * * * *